US006828571B1

(12) United States Patent
McCord et al.

(10) Patent No.: US 6,828,571 B1
(45) Date of Patent: Dec. 7, 2004

(54) APPARATUS AND METHODS OF CONTROLLING SURFACE CHARGE AND FOCUS

(75) Inventors: Mark A. McCord, Los Gatos, CA (US); Jan A. Lauber, San Jose, CA (US); Paul Petric, Pleasanton, CA (US); Ross W. Thompson, Santa Clara, CA (US); Jason Lim, San Jose, CA (US); Frank Y. H. Fan, Pleasanton, CA (US); Gabor D. Toth, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/699,708

(22) Filed: Nov. 3, 2003

Related U.S. Application Data
(60) Provisional application No. 60/503,640, filed on Sep. 17, 2003.

(51) Int. Cl.$^7$ .................... H01L 21/00; G01N 23/225
(52) U.S. Cl. ................. 250/492.2; 250/492.3; 250/310; 250/306; 250/307; 250/397; 250/396 R; 324/750; 324/751
(58) Field of Search ................. 250/310, 306, 250/307, 397, 396 R, 492.2, 492.3; 324/750, 751

(56) References Cited

U.S. PATENT DOCUMENTS

| 6,232,787 B1 | * | 5/2001 | Lo et al. ............... 324/751 |
| 6,344,750 B1 | * | 2/2002 | Lo et al. ............... 324/751 |
| 2002/0130260 A1 | | 9/2002 | McCord et al. |

* cited by examiner

Primary Examiner—Nikita Wells
(74) Attorney, Agent, or Firm—Okamoto & Benedicto LLP

(57) ABSTRACT

One embodiment disclosed relates to a method of setting a surface charge of an area on a substrate to a desired level. The substrate is held on a stage, and a stage bias voltage applied to the stage is controlled. A flood of electrons is directed to the area. The stage bias voltage is controlled such that the surface charge of the area reaches an equilibrium at the desired level. Another embodiment disclosed relates to a method of auto-focusing a main electron beam incident upon an imaging area of a substrate. A monitor electron beam is generated and directed towards a monitoring area of the substrate at a non-perpendicular incidence angle. An in-focus band in data collected from the monitor beam is detected. The focal length of an objective lens focusing the main beam is adjusted based upon a position of the in-focus band.

28 Claims, 10 Drawing Sheets

APPARATUS AND METHODS OF CONTROLLING SURFACE CHARGE AND FOCUS

CROSS-REFERENCE TO RELATED APPLICATIONS

The present application claims the benefit of provisional patent application No. 60/503,640, filed Sep. 17, 2003, entitled "Apparatus and Methods of Controlling Surface Charge and Focus", by inventors Mark A. McCord, Jan Lauber, Paul Petric, Ross Thompson, Jason Lim, Frank Fan, and Gabor D. Toth, the disclosure of which is hereby incorporated by reference.

BACKGROUND OF THE INVENTION

1. Field of the Invention

The present invention relates generally to specimen inspection and review. More particularly, the present invention relates to electron beam inspection and review systems.

2. Description of the Background Art

Automated inspection and review systems are important in process control and yield management for the semiconductor and related microelectronics industries. Such systems include optical and electron beam (e-beam) based systems.

In the manufacture of semiconductor devices, detection of electrical failure earlier in the fabrication process is becoming Increasingly important to shorten product development cycles and increase product yield and productivity. Advanced wafer inspection systems based on scanning electron microscopy technology has been used to detect electrical failure in-line as voltage contrast defects. However, as device design rules further shrink, and new processes (such as, for example, high aspect ratio (HAR) contacts in front-end-of-line (FEOL), HAR vias in back-end-of-line (BEOL), and dual damascene copper processes) are being widely implemented, it becomes more challenging to detect voltage contrast defects in ever increasing high aspect ratio device structures. Further, image contrast variation caused by uneven charge distribution can make e-beam inspection unstable or un-inspectable. Such contrast variation can occur from inside a die, from die to die, row to row, or wafer to wafer. In order to successfully inspect a wafer, control of surface charge is advantageous to 1) detect voltage contrast defects effectively, and 2) reduce image contrast variation during inspection.

FIG. 1 is a simplified diagrammatic representation of a conventional scanning electron microscopy configuration 100. As shown, a beam of electrons 102 is scanned over a sample 104 (e.g., a semiconductor wafer). Multiple raster scans 112 are typically performed over a small area 114 of the sample 104. The beam of electrons 102 either interact with the sample and cause an emission of secondary electrons 106 or bounce off the sample as backscattered electrons 106. The secondary electrons and/or backscattered electrons 106 are then detected by a detector 108 that is coupled with a computer system 110. The computer system 110 generates an image that is stored and/or displayed on the computer system 110.

Typically a certain amount of charge is required to provide a satisfactory image. This quantity of charge helps bring out the contrast features of the sample 104. Although conventional electron microscopy systems and techniques typically produce images having an adequate level of quality under some conditions, they produce poor quality images of the sample for some applications. For example, on a sample 104 made of a substantially insulative material (e.g., silicon dioxide), performing one or more scans over a small area causes the sample to accumulate excess positive or negative charge in the small area relative to the rest of the sample 104. The excess charge generates a potential barrier for some of the secondary electrons, and this potential barrier inhibits some of the secondary electrons from reaching the detector 108. Since this excess positive charge is likely to cause a significantly smaller amount of secondary electrons to reach the detector 108, an image of the small area is likely to appear dark, thus obscuring image features within that small area. Alternatively, excess negative charge build up on the sample can increase the collection of secondary electrons causing the image to saturate. In some cases, a small amount of charging is desirable since it can enhance certain image features (by way of voltage contrast) as long as it does not cause image saturation.

The excess charge remaining from a-previous viewing or processing may therefore cause distortion. One solution used in SEM devices is to flood the sample with charged particles from a separate flood gun at a time separate from the inspection. This flooding equalizes the charge appearing across the sample 104, thus improving the voltage contrast images. One drawback to this flooding procedure is the need to move the stage including the entire sample to the area of the flood gun. In order to accomplish the flooding, the inspection must stop to permit movement of the sample 104 to the area of the flood gun. This dramatically increases the overall time required for the inspection since movement and flooding of the sample may take ten minutes or more to complete. This produces an equally dramatic decrease in the throughput for the inspection process. Typically a full inspection of a sample 104 will require hundreds of scan lines across the sample and the dissipation of charge may be required after only a few scan lines have been completed. The total time required for a sample 104 to be inspected therefore is the sum of the separate intervals for charge dissipation (or precharging) and inspection.

In regards to the focus of an electron image, a change in the surface charge for the area being imaged can also cause the image to go out of focus. In addition, a change in the height of the area being imaged may cause the image to go out of focus. Existing techniques to deal with these variations in surface charge and sample height include measuring surface charge with a Kelvin probe or secondary electron cut-off points and measuring the sample height by way of light or capacitative sensors. The data from these measurements may then be used to determine an adjustment of the focus. However, these existing techniques are disadvantageously complicated and/or inefficient. For example, measurement of surface charge with a Kelvin probe involves a large area to make the measurement and is typically slow.

Hence, as discussed above, efficient and effective control over the charge on the surface of a sample 104 is desirable to improve the speed of obtaining images and the quality of images obtained during electron beam inspection or review. Furthermore, it is desirable to improve techniques for focusing an electron image in dependence on surface charge and sample height variations.

SUMMARY

One embodiment of the invention pertains to a method of setting a surface charge of an area on a substrate to a desired level. The substrate is held on a stage, and a stage bias voltage applied to the stage is controlled. A flood of electrons is directed to the area. The stage bias voltage is controlled such that the surface charge of the area reaches an equilibrium at the desired level.

Another embodiment of the invention pertains to a method of auto-focusing a main electron beam incident upon an imaging area of a substrate. A monitor electron beam is generated and directed towards a monitoring area of the substrate at a non-perpendicular incidence angle. An in-focus band in data collected from the monitor beam is detected. The focal length of an objective lens focusing the main beam is adjusted based upon a position of the in-focus band.

DETAILED DESCRIPTION

Figure 1:
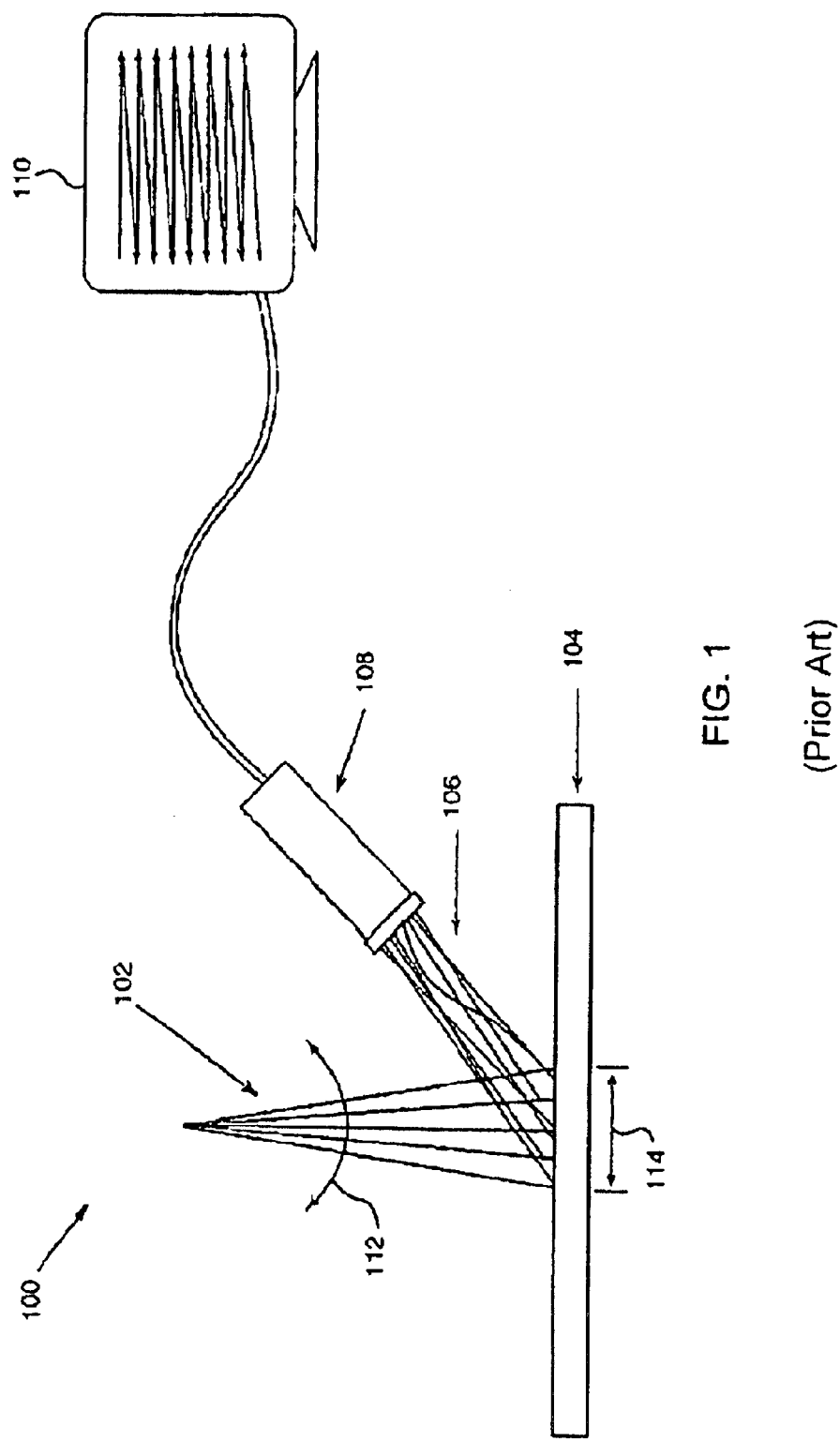
FIG. 1 is a simplified diagrammatic representation of a conventional scanning electron microscopy configuration.
Figure 2:
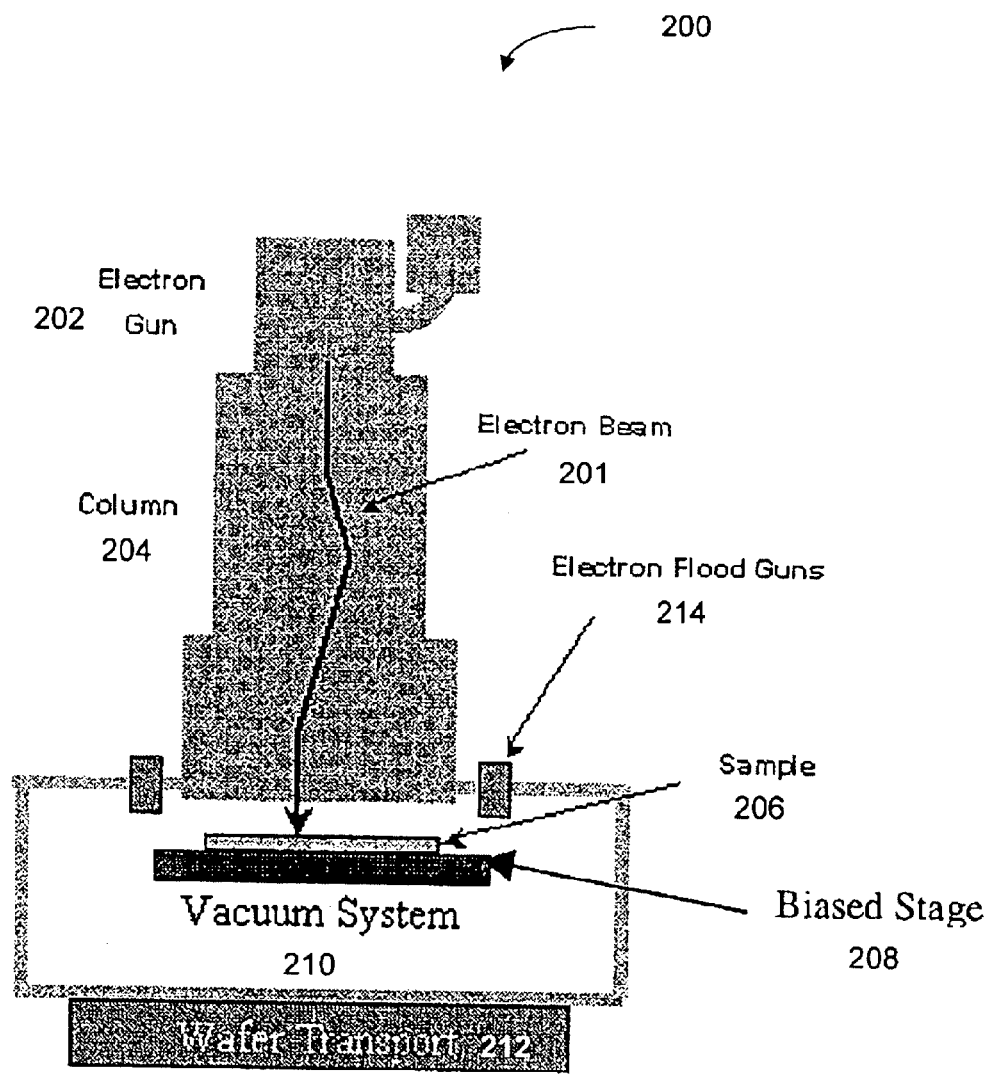
FIG. 2 Is a schematic diagram of an electron beam inspection system in accordance with an embodiment of the invention.

FIG. 2 is a schematic diagram of an electron beam inspection system 200 in accordance with an embodiment of the invention. The e-beam system 200 generates and directs an incident electron beam 201 towards an area of interest on a sample 206. As shown in FIG. 2, the electron beam 201 may be generated by an electron gun 202. A column 204 including various components in a vacuum is used to direct the electron beam 201 towards the surface of the sample 206. The column 204 typically includes various electron lenses, apertures, and other components.

In accordance with an embodiment of the invention, the sample 206 is on a biased stage 208. The biased stage 208 is coupled to control circuitry that is configured to control and set the voltage bias level of the stage 208. One embodiment of the control circuitry is described below in relation to FIG. 3. Like the column 204, because the incident beam comprises electrons, a vacuum system 210 is used to pump the chamber containing the sample or specimen 206 and biased stage 208 (as well as the column 204). The sample may comprise, for example, a wafer or other substrate. A wafer transport system 212 may be used to move wafer samples to be inspected in-line as part of a manufacturing process.

In accordance with an embodiment of the invention, one or more electron flood guns 214 are Included in the e-beam system 200. The flood gun(s) 214 may be utilized to flood the wafer with a broad beam of electrons prior to inspection being performed. In addition, or alternatively, a Wehnelt electrode (not shown) may also be included above the sample. The voltage on the Wehnelt electrode may be varied to control the surface charge on the wafer.

The e-beam system 200 also includes a detector (not shown) configured to detect charged particles (secondary electrons and/or backscattered electrons) emitted from the sample. The e-beam system 200 may also include an image generator (not shown) for forming an image from the detected emitted particles.

Figure 3:
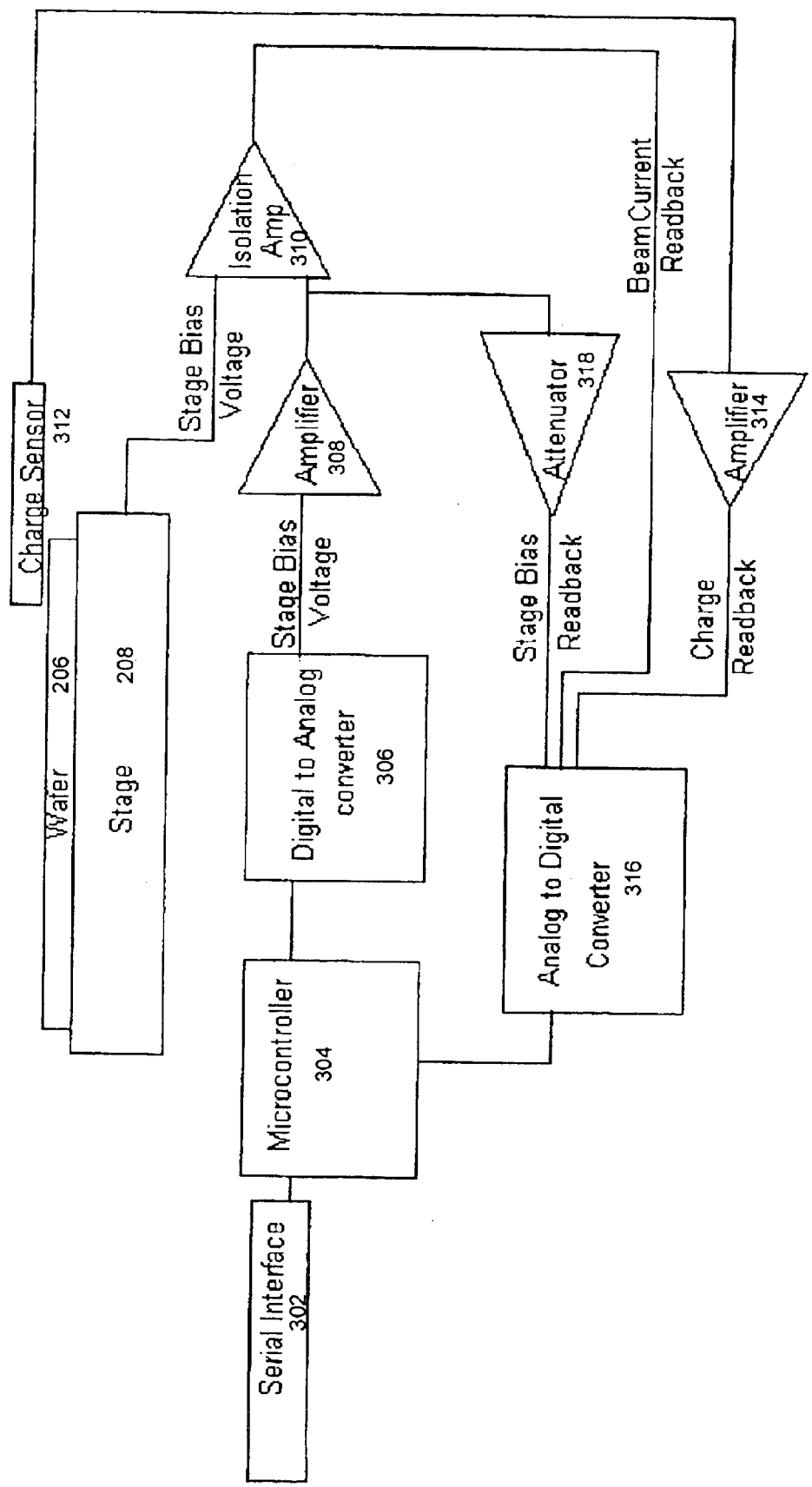
FIG. 3 is a diagram depicting stage bias control circuitry in accordance with an embodiment of the invention.

FIG. 3 is a diagram depicting stage bias control circuitry in accordance with an embodiment of the invention. The control circuitry includes a microcontroller 304 that sets the stage bias voltage using a digital-to-analog converter (DAC) 306 and reads back the stage bias voltage, beam current, and charge voltage via an analog-to-digital converter (ADC) 316. A serial interface 302 may be used for communications between the system controller (not shown) and the microcontroller 304. Using the serial interface 302, the system controller can set the stage bias level.

The output of the DAC 306 is amplified to an appropriate voltage by an amplifier 308 and fed into one input of an isolation amplifier 310. This drives the other input of the isolation amplifier 310 to the desired voltage level. This other input is connected to the stage 208 and sample (for example, wafer) 206.

The bias voltage output by the amplifier 308 is also attenuated by an attenuator 318 and may be fed into the ADC 316 as the stage bias readback signal. This allows the stage bias voltage to be monitored by the controller 304.

Beam currents to the wafer 206 may also be monitored by reading the output of the isolation amplifier 310. The output of the isolation amplifier 310 is a voltage that is a measure of the total beam current. This voltage may be fed into the ADC 316 as the beam current readback signal. This allows a measure of the beam current to be sampled by the microcontroller.

In addition, a charge sensor 312 is configured within proximity to the surface of the specimen (for example, wafer) 206. The charge sensor 312 measures the charge deposited on the specimen. The output of the sensor 312 may be fed into the ADC 316 as the charge readback signal. This voltage may also be monitored by the controller 304.

Figure 4:
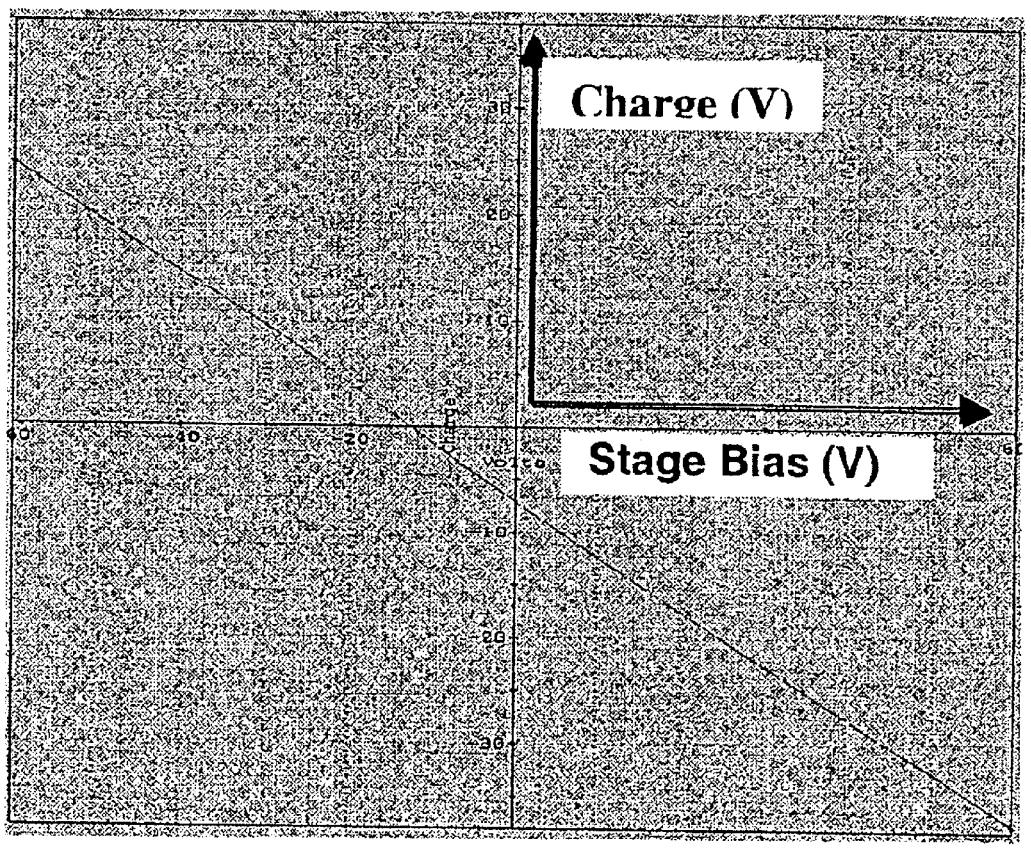
FIG. 4 is a graph of test results showing resultant surface charge levels as a function of stage bias levels in accordance with an embodiment of the invention.

FIG. 4 is a graph of test results showing resultant surface charge levels as a function of stage bias levels in accordance with an embodiment of the invention. The horizontal axis is a stage bias voltage level that is set prior to flooding. The vertical axis is a voltage that gives a measure of surface charge on the sample after flooding. As seen, the surface charge is an almost linear function of stage bias. As depicted, the more positive the stage bias voltage, the more negative the surface charge. The more negative the stage bias voltage, the more positive the surface charge. Hence, it is shown that the surface charge can be controlled by setting the stage bias and then flooding with electrons.

Figure 5:
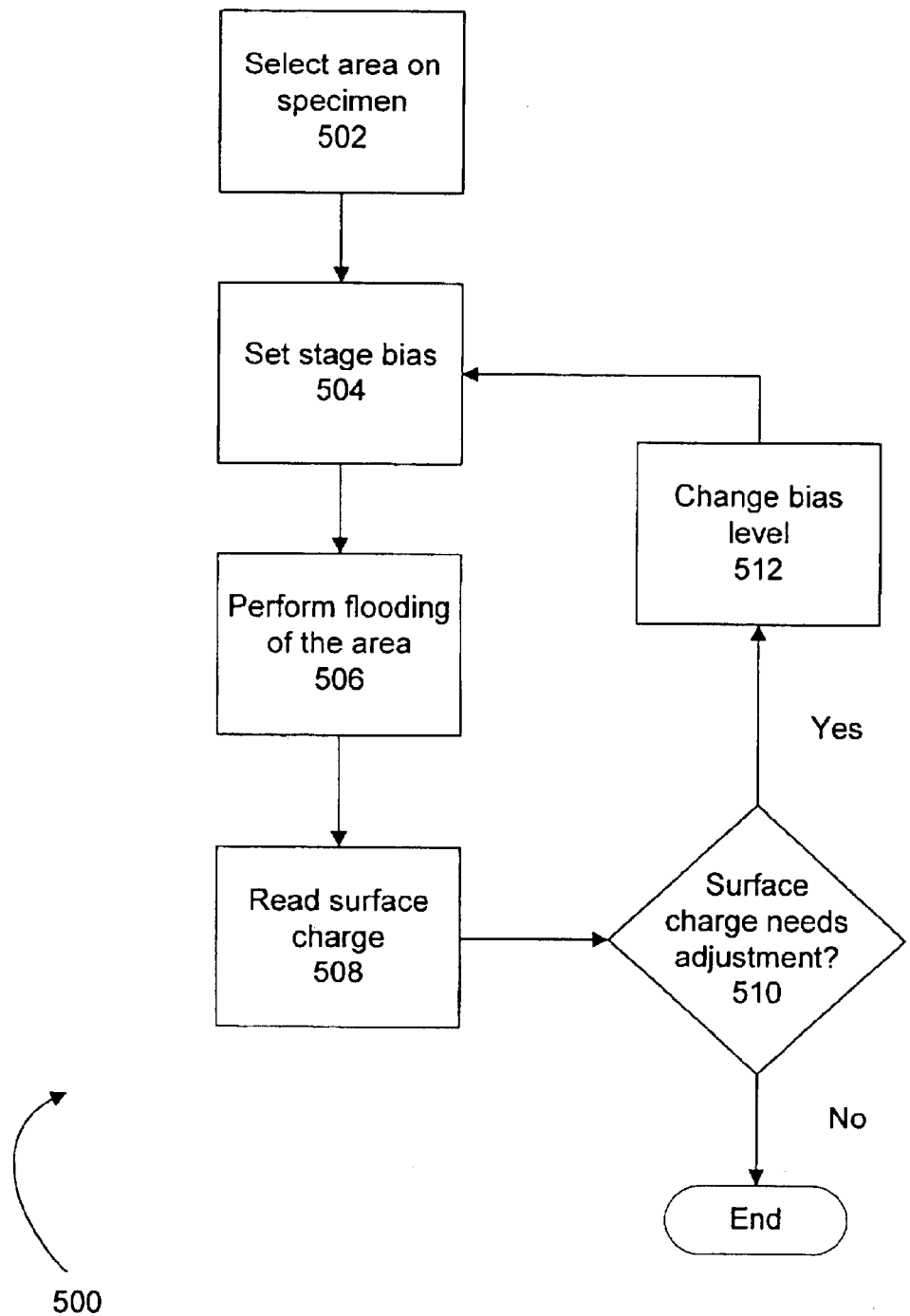
FIG. 5 is a flow chart depicting a first method for setting a surface charge level of an area of a specimen in accordance with an embodiment of the invention.

FIG. 5 is a flow chart depicting a first method 500 for setting a surface charge level of an area of a specimen in accordance with an embodiment of the invention. This method 500 involved adjusting the stage bias to achieve the desired surface charge.

The area on the specimen is selected 502 for surface charge control. A stage bias is set 504 at a voltage level.

Flooding 506 is performed on the area by an electron flood beam. The flooding 506 is preferably performed sufficiently long such that the surface charge reaches an equilibrium level. The equilibrium surface charge depends on the stage bias in a manner similar to the test data illustrated in FIG. 4. The exact dependence will depend on the nature of the specimen and may vary from system to system. The resultant surface charge level is read 508 using a sensor or probe. A determination 510 is made as to whether the surface charge is at the desired level or whether adjustment is needed. If adjustment of the surface charge is needed, then the bias level may be changed 512, and the process 500 loops back to setting 504 the stage bias to the changed level, flooding 506 the area, and so on. If no adjustment is needed, then the process 500 of setting the surface charge level ends.

Following this process 500, for example, e-beam inspection or review of the area may be performed. The inspection or review may include the use of voltage contrast. Advantageously, by controlling the surface charge level, the effect of voltage contrast can be greatly enhanced, manifesting voltage contrast defects that may not appear otherwise. The number of voltage contrast defects detected may thus be considerably increased, providing a more true representation of defectivity issues, such as defect distribution and defect density data on the wafer. Such data is essential for fabrication defect and process engineers to correct process problems and improve manufacturing yield. Further, contrast variation may also be advantageously reduced, enabling more successful inspections.

Figure 6:
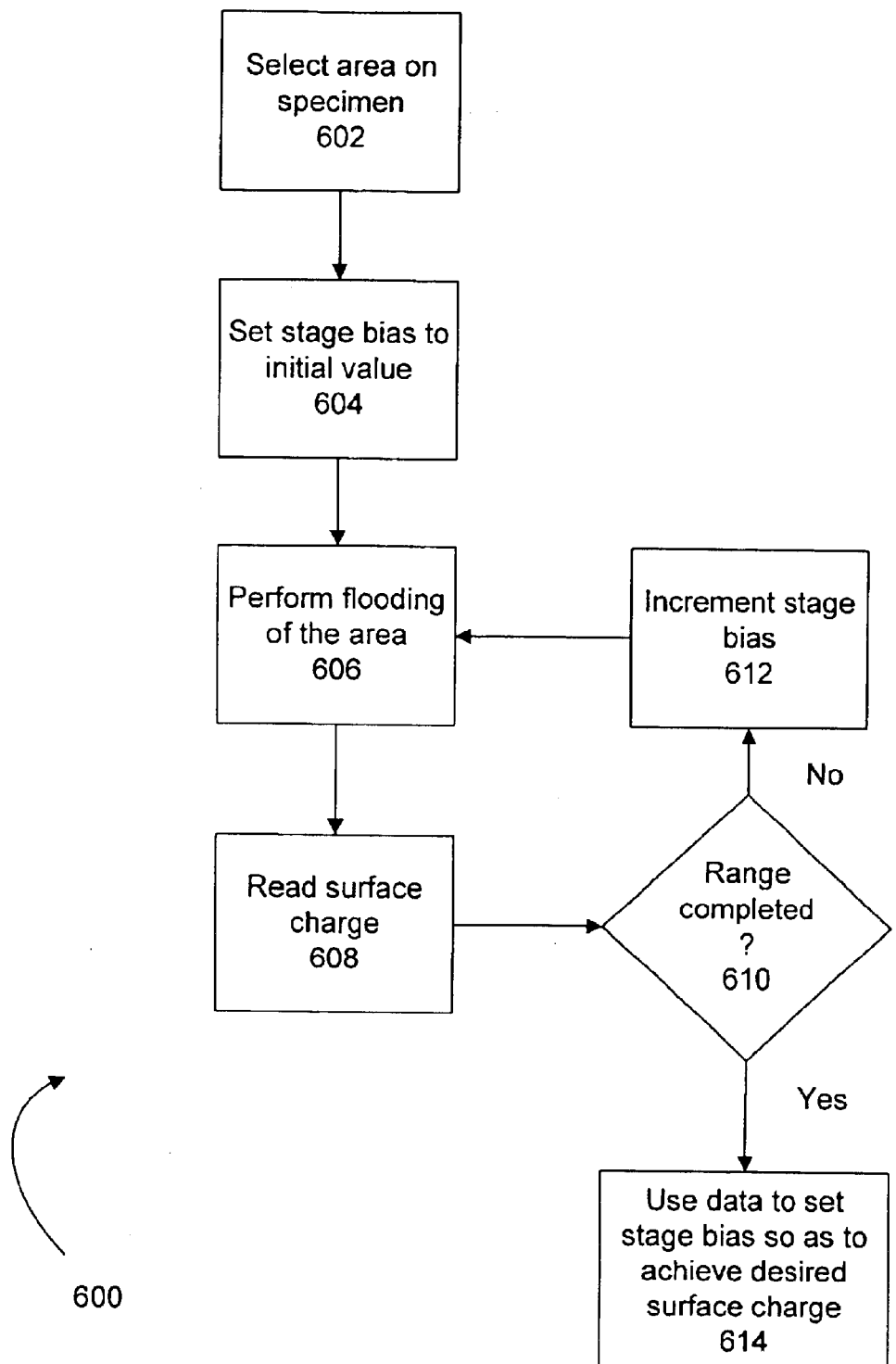
FIG. 6 is a flow chart depicting a second method for setting a surface charge level of an area of a specimen in accordance with an embodiment of the invention.

FIG. 6 is a flow chart depicting a second method 600 for setting a surface charge level of an area of a specimen in accordance with an embodiment of the invention. This method 600 makes a series of measurements over a range of stage biases to determine the dependency of surface charge on stage bias. Knowing the dependency, the desired surface charge may be achieved by setting the stage bias accordingly.

The area on the specimen is selected 602 for surface charge control. A stage bias is set 604 at an initial voltage level. Flooding 606 is performed on the area by an electron flood beam. The flooding 606 is preferably performed sufficiently long such that the surface charge reaches an equilibrium level. The resultant surface charge level is read 608 using a sensor or probe.

A determination 610 is made as to whether the desired range of voltages for the stage bias has been covered or completed. If the range has not been completed, then the stage bias is incremented 612, and the process 600 loops back to flooding 606 the area, reading 608 the surface charge, and so on. If the range has been completed, then the process 600 moves on to use 614 the data obtained to set the stage bias so as to achieve the desired surface charge. In other words, once the dependency of surface charge on stage bias has been determined, the dependency function may be used to set the stage bias so as to achieve the desired surface charge.

Following this process 600, for example, e-beam inspection or review of the area may be performed. The inspection or review may include the use of voltage contrast. Advantageously, by controlling the surface charge level, the effect of voltage contrast can be greatly enhanced, manifesting voltage contrast defects that may not appear otherwise.

The above-described techniques control surface charge of a semiconductor wafer or other specimen through flooding. During flooding, the stage is biased to control the final charge on the specimen surface. The stage can be biased either negatively or positively, depending on the desired final charge on the wafer surface.

The above-described techniques include both "manual" and "automatic" modes. In manual mode, an area on the specimen to be flooded is first selected. A stage bias is selected, and flooding is performed. Then, the charge after flooding is read with a charge measurement device. In automatic mode, a test process is used to perform flooding at different stage biases over a prescribed range, and a curve or function is generated from the test. An example of such test results is shown in FIG. 4. The curve or function is then used to select the stage bias, and flooding is performed to achieve the desired surface charge.

Detection of electrical failure as voltage contrast defects is important in yield management in semiconductor manufacturing. The above-described techniques for controlling surface charge levels can substantially enhance the performance of e-beam inspection systems in the detection of voltage contrast defects. The above-described techniques may also enable or improve the performance of inspection on wafers that may otherwise charge severely during the inspection. The above-described techniques may be implemented, for example, on a scanning electron microscope based inspection or review tool. They may also be implemented on a direct imaging (non-scanning) electron microscope based system, or an energy-dispersive x-ray system, or other systems.

Figure 7:
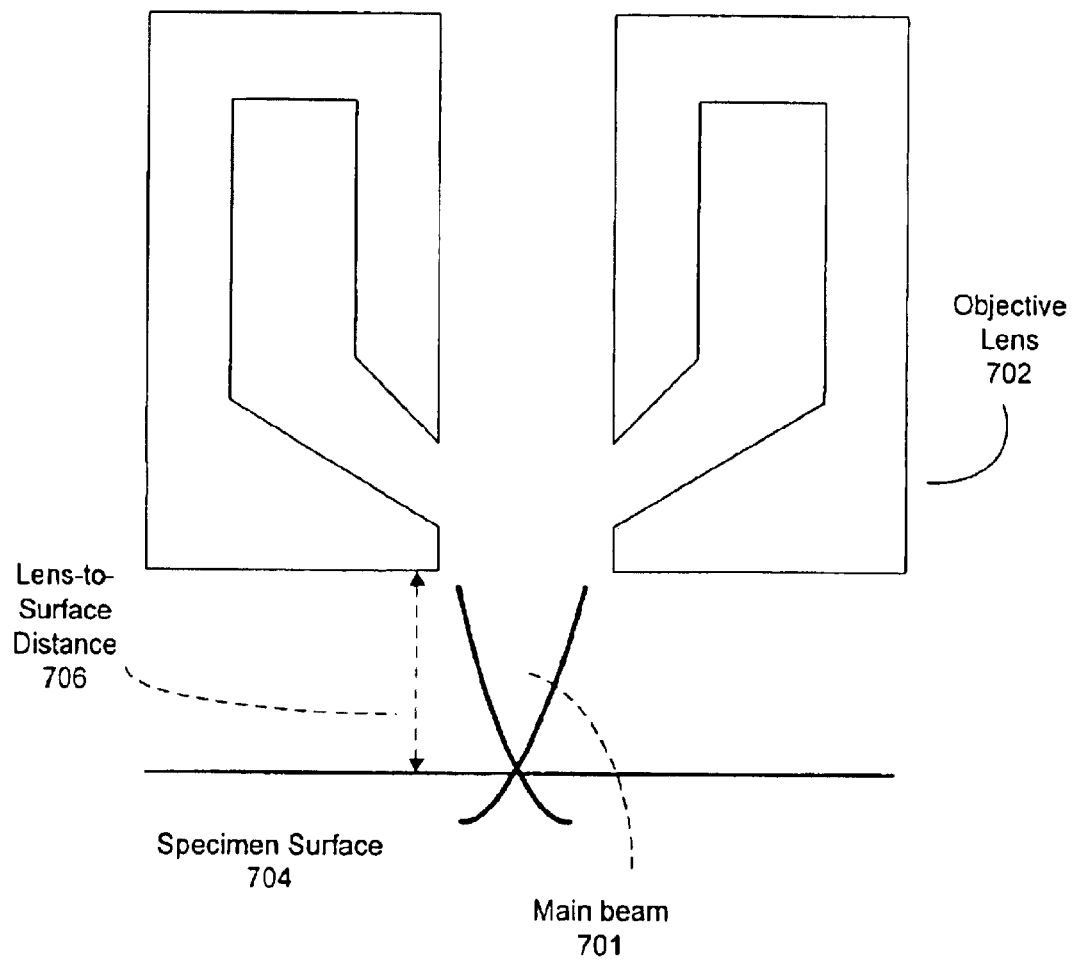
FIG. 7 is a schematic diagram depicting focusing of an incident electron beam onto a specimen surface.

FIG. 7 is a schematic diagram depicting focusing of an incident electron beam onto a specimen surface. An objective lens 702 of an electron column focuses the "main" incident beam 701 on the specimen surface 704.

Two factors affect the focus and result in out-of-focus conditions.

One factor is the lens-to-surface distance 706. In other words, variation in the mechanical height of the specimen surface can cause a resultant electron image to be out of focus. Variation in mechanical height is typically measured with light or capacitative sensors. A second factor is the level of charge on the specimen surface 704. This is typically measured with a Kelvin probe or using secondary electron cut-off points. Neither measuring the first factor nor measuring the second factor alone provides adequate information to determine the required focal length for the electron imaging tool during a review or inspection run. Hence, prior techniques make two separate measurements to determine both mechanical height and surface charge.

Figure 8:
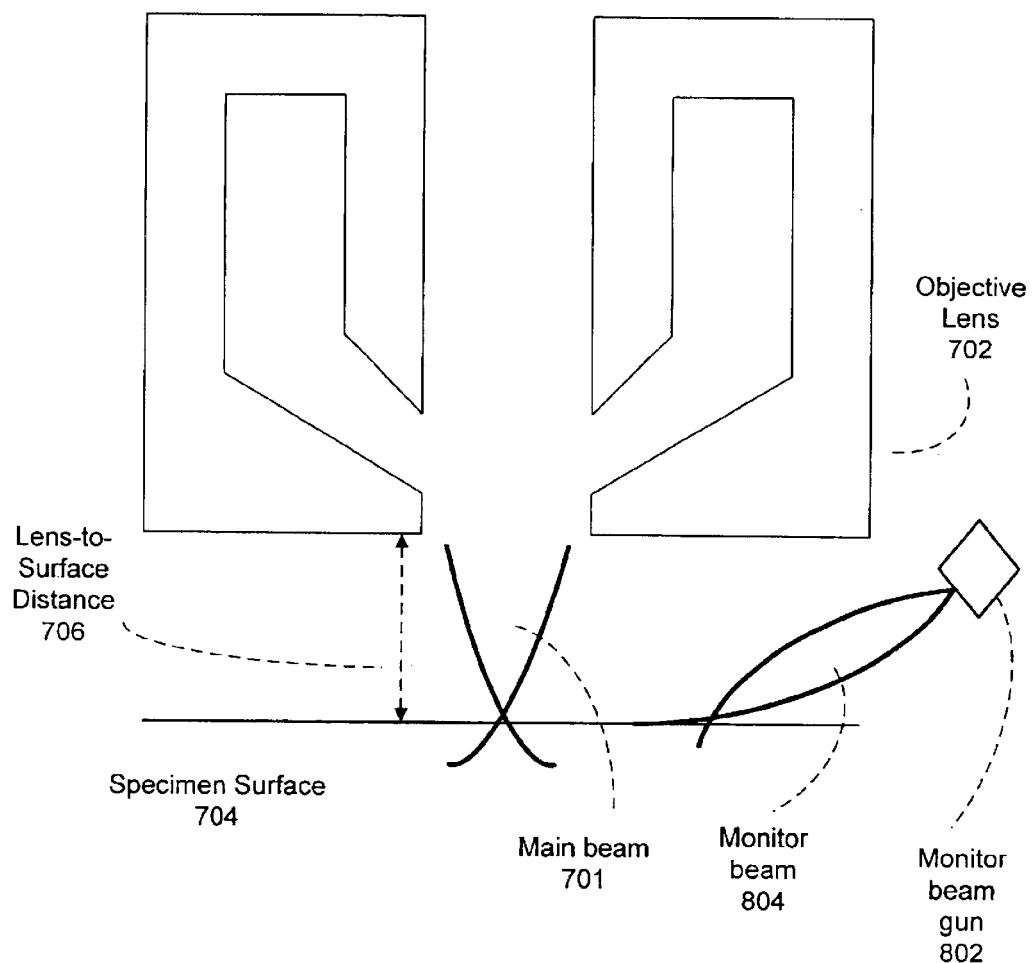
FIG. 8 is a schematic diagram depicting focusing of an incident electron beam onto a specimen surface using an apparatus in accordance with an embodiment of the present invention.

FIG. 8 is a schematic diagram depicting focusing of an incident electron beam onto a specimen surface using an apparatus in accordance with an embodiment of the present invention. In addition to the components shown in FIG. 7, a monitor beam gun 802 is included in the configuration of the apparatus. The monitor beam gun 802 may comprise, for example, an electron beam generating by a relatively low-cost flood gun with scanning capabilities. The monitor beam 804 may be imaged with relatively low-resolution (for example, around 0.1 to 1 micron resolution).

The monitor beam 804 is incident upon the specimen surface 704 at a non-perpendicular angle. In a preferred embodiment, the monitor beam 804 is incident upon the surface 704 at a relatively low angle (alpha) from around 10 to 30 degrees (as measured from the plane of the surface). Preferably, the field-of-view (FOV) for the monitor beam 804 is such that FOV multiplied by cosine (alpha) is many times larger than the depth-of-field (DOF) of the monitor beam. For example, in accordance with a preferred embodiment, FOV multiplied by cosine(alpha) may be one hundred times or more than the DOF.

In one embodiment, the monitor beam 804 may be configured to periodically scan a single frame with a fixed focal length. Conventional lower electron detectors may be used to capture the signal for the image. During the scan of the monitor beam 804, the high-resolution imaging beam (the "main" beam) 701 is preferably turned off or blocked out. This is to avoid undesirable interference between the two beams. After scan of the monitor beam 804 is completed, the high-resolution imaging beam 701 may be turned on or unblocked.

Due to the tilted incidence angle and the DOF being much smaller than the FOV, an image acquired by the monitor beam 804 will contain a distinct in-focus band, surrounded by out-of-focus regions. At best focus conditions, the in-focus band will be positioned at a certain location in the FOV. Keeping fixed the focal length of the monitor beam 804, a subsequent shift up or down of the in-focus band then indicates a change in either the specimen height or surface charge. As such, the position of the in-focus band is correlated with and indicative of the focus conditions of the main imaging beam at that area. In other words, this technique provides a single measurement of the combined focus metric contributions from both wafer height variation and surface charge variation. This single measurement is advantageous over the dual measurements required by the conventional techniques. The overhead time to maintain focus of the main beam 701 can be substantially reduced using this technique in comparison to conventional techniques. The overhead time of this technique comprises the time it takes to acquire the monitor image, compute the position of the in-focus band, and set the main beam focal length accordingly. Preferably, the overhead time takes a few hundred milliseconds or less. This is substantially faster than conventional auto-focus routines.

In addition to the monitoring purpose, the monitor beam gun 802 may also serve the purpose of pre-charging the wafer at the imaging area per the techniques described above. Hence, in one embodiment, the monitor gun 802 may comprise one of the flood guns 214 depicted in FIG. 2. In another embodiment, the monitor gun 802 may comprise a separate electron gun.

Figure 9:
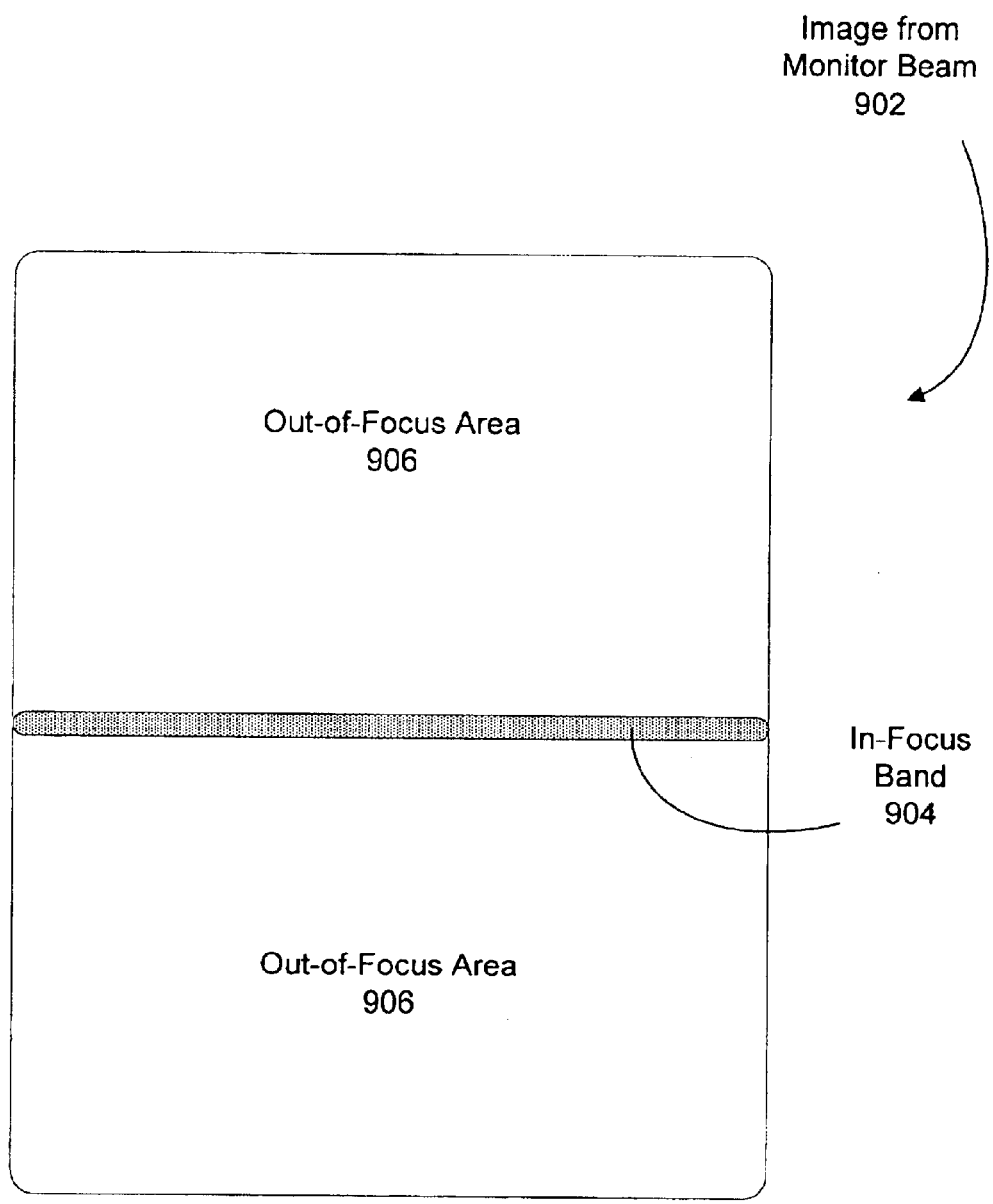
FIG. 9 is an illustrative diagram depicting a two-dimensional in-focus band in accordance with an embodiment of the present invention.

FIG. 9 is an illustrative diagram depicting a two-dimensional in-focus band in accordance with an embodiment of the present invention. The diagram illustrates a two-dimensional image 902 captured by the monitor beam. Due to the tilt of the monitor beam, the image has an in-focus band 904 surrounded by out-of-focus areas 906.

In an actual implementation, the field of view may be of a different shape than that illustrated. Furthermore, the in-focus band 904 preferably comprises a smaller fraction of the field of view than the fraction illustrated.

In accordance with one embodiment, the monitor beam is directed to a same area as is being imaged by the main beam. In accordance with another embodiment, the monitor beam Is directed to a separate area that is relatively near the area being imaged by the main beam, such that the focal metric derived from the monitor beam is still a meaningful focal metric for the main beam. In the latter embodiment, the monitor beam and the main beam may both be on at the same time.

Preferably, the area imaged by the monitor beam has sufficient detail to enable an algorithm to accurately locate the in-focus band 904. The algorithm to locate the in-focus band 904 may comprise, for example, determining the band in the image 902 with the most high-frequency spatial content (or edge content). That determination may be accomplished, in part, by taking a Fourier transform of the captured image 902. The band with the most high-frequency spatial content should correspond to the in-focus band 904, while areas with less high-frequency content should typically correspond to the out-of-focus areas 906.

Figure 10:
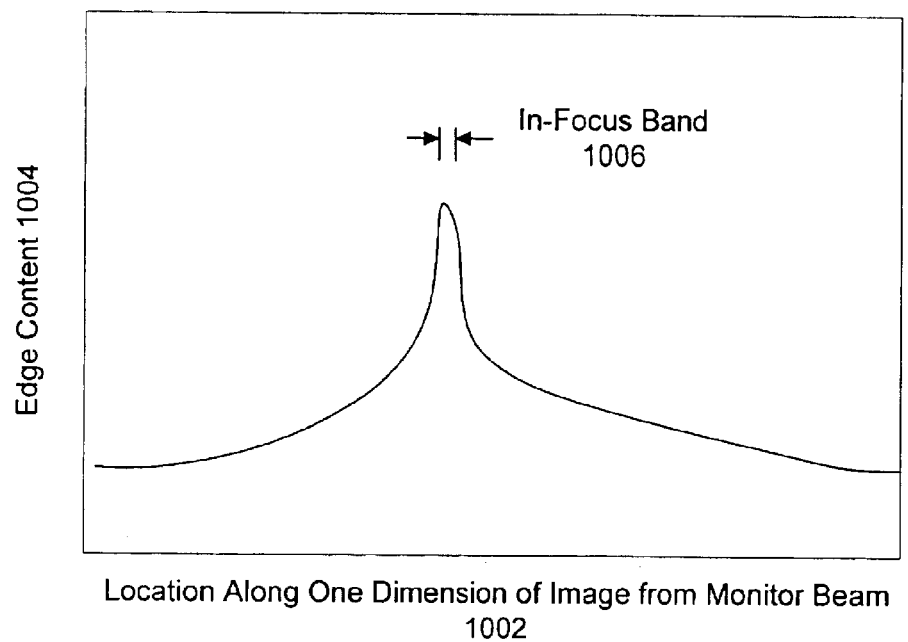
FIG. 10 is a graph depicting a one-dimensional in-focus band in accordance with an embodiment of the present invention.

FIG. 10 is a graph depicting a one-dimensional in-focus band in accordance with an embodiment of the present invention. The x-axis of the graph represents the location 1002 along one dimension of the image from the monitor beam. The one dimension would correspond to the vertical dimension of the image shown in FIG. 9. The y-axis of the graph represents the edge content 1004 for the band at that location along the one dimension. The edge content is a measure of the high-frequency spatial content in the band.

As depicted in FIG. 10, the edge content 1004 is highest in a "band" around a location along the one dimension. That location corresponds to the location of the in-focus band 1006.

As described above, tracking a location of an in-focus band in an image from a tilted monitor beam may be used to measure a focal metric applicable to the main imaging beam. Advantageously, the focal metric so derived from this single measurement accounts for variations in both structural height and surface charge.

A different technique involves a separate measurement of wafer height and surface charge. If real-time closed loop height sensing hardware is included to compensate for wafer height variation, the surface charge measurement remains as the only task. Measurement of surface charge with a Kelvin probe is typically slow and involves too large of an area. Instead, the following surface charge measurement may be advantageously used for auto-focusing.

An electron detector equipped with a proper energy filter may be used for measuring the secondary electron cut-off point. The electron detector with energy filter may comprise, for example, a detector located in an upper region of the column. Such a detector may be ramped through a voltage range (from +100 volts to −100 volts, for example) with respect to the wafer bias. During this fast voltage ramp, signal is acquired but an image is not formed. The acquired signal as a function of energy filter voltage will exhibit a distinct bright-to-dark (high-to-low) transition. The position and width of this transition is determined by and indicative of the surface charge. The main beam imaging system will then set the objective lens focal length accordingly and start the image capture with the correct focal length. Since this is a single voltage ramp on the energy filter, the charge measurement process is advantageously expected to take less than 100 milliseconds.

The above-described diagrams are not necessarily to scale and are intended be illustrative and not limiting to a particular implementation. The above-described invention may be used in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other Instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus configured with a capability of setting a surface charge of an area on a substrate to a desired voltage level, the apparatus comprising:

a column for generating an imaging electron beam and for directing the imaging beam to the area;

an electron flood gun for generating a flood electron beam and for directing the flood beam to the area;

a stage for holding the substrate; and circuitry for controlling a stage bias voltage applied to the stage, wherein the stage bias voltage is set prior to flooding the area, and wherein the stage bias voltage is controlled so as to be substantially proportional to the desired voltage level of the surface charge.

2. The apparatus of claim 1, wherein the substrate comprises a semiconductor wafer.

3. The apparatus of claim 1, wherein the apparatus comprises an e-beam inspection/review tool.

4. The apparatus of claim 1, wherein the circuitry includes an isolation amplifier to isolate a generated bias voltage from the stage bias voltage applied to the stage.

5. The apparatus of claim 4, wherein the circuitry further includes a digital-to-analog converter and an amplifier to produce the generated bias voltage.

6. The apparatus of claim 5, wherein the circuitry further includes an attenuator that attenuates the generated bias voltage to form a stage bias readback signal that is input into an analog to digital converter.

7. The apparatus of claim 4, wherein the output of the isolation amplifier comprises a beam current readback signal that is input into an analog to digital converter.

8. The apparatus of claim 1, further comprising a charge sensor positioned in proximity to the area on the substrate for measuring the surface charge.

9. The apparatus of claim 8, wherein the charge sensor originates a charge readback signal that is input into an analog to digital converter.

10. The apparatus of claim 1, wherein the circuitry comprises a microcontroller configured to maintain control of the surface charge.

11. The apparatus of claim 10, wherein the microcontroller is coupled to the system controller by way of a communications interface.

12. A method of setting a surface charge of an area on a substrate to a desired voltage level, the method comprising:

holding the substrate in a stage;

controlling a stage bias voltage applied to the stage; and directing a flood of electrons to the area such that the surface charge of the area reaches an equilibrium at the desired voltage level, and wherein the stage bias voltage is controlled so as to be substantially proportional to the desired voltage level.

13. The method of claim 12, further comprising:

measuring the surface charge of the area.

14. The method of claim 13, further comprising:

determining if the surface charge of the area needs adjustment;

changing the stage bias voltage applied to the stage; and re-flooding the area with electrons.

15. The method of claim 12, further comprising:

varying the stage bias voltage over a range of voltages; and for each voltage in the range, flooding the area with electrons, and reading the surface charge, so as to determine a relationship between the stage bias voltage and the surface charge.

16. An apparatus configured with a capability to maintain focus of a main electron beam incident upon a substrate, the apparatus comprising:

a column configured to generate and direct the main beam towards an imaging area of the substrate;

an objective lens with a variable focal length that is configured to focus the main beam onto the imaging area;

a monitor beam gun configured to generate and direct a monitor electron beam towards a monitoring area of the substrate at a non-perpendicular incidence angle; and an in-focus detector configured to detect an in-focus band in data collected from the monitor beam, wherein the monitoring area of the substrate has sufficient edge content so as to locate the in-focus band between out-of-focus areas.

17. The apparatus of claim 16, wherein the incidence angle of the monitor beam is less than thirty degrees.

18. The apparatus of claim 16, wherein the in-focus detector detects the in-focus band by analyzing two-dimensional image data collected from the monitor beam.

19. The apparatus of claim 16, wherein the in-focus detector detects the in-focus band by analyzing edge content along one dimension collected from the monitor beam.

20. The apparatus of claim 16, wherein the imaging area and the monitoring area comprises a same area, and wherein the main beam does not impinge upon the area while the monitor beam is active.

21. A method of auto-focusing a main electron beam incident upon an imaging area of a substrate, the method comprising:

generating a monitor electron beam;

directing the monitor beam towards a monitoring area of the substrate at a non-perpendicular incidence angle;

detecting an in-focus band in data collected from the monitor beam; and adjusting a focal length of an objective lens focusing the main beam based upon a position of the in-focus band, wherein the monitoring area of the substrate has sufficient edge content so as to locate the in-focus band between out-of-focus areas.

22. The method of claim 21, wherein the imaging area and the monitoring area comprises a same area, and wherein the main beam does not impinge upon the area while the monitor beam is active.

23. The method of claim 21, wherein the imaging area and the monitoring area comprises separate areas.

24. The method of claim 21, wherein the incidence angle of the monitor beam is less than thirty degrees.

25. The method of claim 21, wherein the in-focus band is detected by analyzing two-dimensional image data collected from the monitor beam.

26. The method of claim 21, wherein the in-focus band is detected by analyzing the edge content along one dimension collected from the monitor beam.

27. The method of claim 21, wherein the focal length is effectively adjusted by adjusting a stage bias level applied to a stage holding the substrate.

28. A method of setting a surface charge of an area on a substrate to a desired voltage level and maintaining focus of a main electron beam incident upon the area, the method comprising:

holding the substrate in a stage;

controlling a stage bias voltage applied to the stage wherein the stage bias voltage is controlled so as to be substantially proportional to the desired voltage level of the surface charge;

directing a flood of electrons to the area such that the surface charge of the area reaches an equilibrium at the desired voltage level;

imaging the area with the main beam;

generating a monitor electron beam;

directing the monitor beam towards a monitoring area of the substrate at a non-perpendicular incidence angle wherein the monitoring area of the substrate has sufficient edge content so as to locate an in-focus band between out-of-focus areas;

detecting the in-focus band in data collected from the monitor beam; and adjusting the stage bias voltage based upon a position of the in-focus band to effectively adjust the focus of the main beam.

* * * * *